United States Patent [19]

Fry et al.

[11] Patent Number: 5,668,063
[45] Date of Patent: Sep. 16, 1997

[54] METHOD OF PLANARIZING A LAYER OF MATERIAL

[75] Inventors: Howard Wallace Fry, Scotts Valley; Kurt James Lightfoot, Ben Lomond, both of Calif.

[73] Assignee: Watkins Johnson Company, Palo Alto, Calif.

[21] Appl. No.: 447,809

[22] Filed: May 23, 1995

[51] Int. Cl.$^6$ ................................................ H01L 21/465
[52] U.S. Cl. .......................... 438/5; 438/692; 438/693; 438/14
[58] Field of Search .................. 437/228, 228 PL, 437/228 ES, 7, 231, 235; 156/626.1, 636.1, 653.1

[56] References Cited

U.S. PATENT DOCUMENTS

| | | | |
|---|---|---|---|
| 4,793,895 | 12/1988 | Kaanta et al. | 156/627 |
| 4,879,258 | 11/1989 | Fisher | 437/225 |
| 5,081,421 | 1/1992 | Miller et al. | 324/671 |
| 5,162,248 | 11/1992 | Dennison et al. | 437/52 |
| 5,169,491 | 12/1992 | Doan | 156/636 |
| 5,204,288 | 4/1993 | Marks et al. | 437/228 |
| 5,209,816 | 5/1993 | Yu et al. | 156/636 |
| 5,222,329 | 6/1993 | Yu | 51/165.77 |
| 5,234,868 | 8/1993 | Cote | 437/225 |
| 5,240,552 | 8/1993 | Yu et al. | 156/636 |
| 5,242,532 | 9/1993 | Cain | 156/626 |
| 5,244,534 | 9/1993 | Yu et al. | 156/636 |
| 5,265,378 | 11/1993 | Rostoker | 51/165 |
| 5,270,241 | 12/1993 | Dennison et al. | 437/52 |
| 5,272,117 | 12/1993 | Roth et al. | 437/228 |
| 5,328,553 | 7/1994 | Poon | 156/636 |
| 5,332,467 | 7/1994 | Sunne et al. | 156/636 |
| 5,356,513 | 10/1994 | Burke et al. | 156/636 |
| 5,366,911 | 11/1994 | Lur et al. | 437/40 |

OTHER PUBLICATIONS

1994 ISMIC-103/94/0015, VMIC Conference, Jun. 7-8, 1994, pp. 15-21—*Fully Integrated Back End Of The Line Interconnect Process For High Performance ULSIs*—Anand, Matsuno, Murota, Shibata, Kakumu, Mori, Otsuka, Takahashi, Kaji, Kodera, Itoh, Aoki, Nagata.

1993 ISMIC-102/93/0028, Jun. 8-9, 1993 VMIC Conference, pp. 28-34—*A Modular In-Situ Integration Scheme For Deep Submicron CMOS Logic And ASIC Applications*—Somero, Blumenthal, Ciosek, Fiordalice, King, Prinz, Sharma, Stager, White, Woo, Klein.

May 1992 Solid State Technology, pp. 87-91—*Planarizing Interlevel Dielectrics By Chemical-Mechanical Polishing*—Sivaram, Bath, Leggett, Maury, Monnig, Tolles.

1990 IEEE VLSI Multilevel Interconnection Conference, Jun. 12-13, 1990 pp. 438-440—*The Mechanical Planarization of Interlevel Dielectrics for Multilevel Interconnect Applications*—Thomas, Sekigahama, Renteln, Pierce.

The VLSI Manufacturing Outlook, Nov. 1993, Section 4.8.3, Paper #1, pp. 3-22—*Chemical Mechanical Polishing*—VLSI Research Inc.

ULSI Research Laboratory, Sep. 16, 1992, pp. 1060-1063, *Nitride-Masked Polishing (NMP) Technique For Surface Planarization of Interlayer-Dielectric Films*—Hayashi and Takahashi.

1993 ISMIC-102/93/0035, 1993 VMIC Conference, Jun. 8-9, pp. 35-41—*A 0.6um Triple Level Metal Process For High Performance Application Specific Integrated Circuits*—Jain, Pramanik, Weling, Gabriel, Baker, Boardman, Eakin.

Anonymous, "Shallow Trench Planarization Process With Chemical-Mechanical Polish Endpoint", IBM Technical Disclosure Bulletin, vol. 33, No. 2, Jul., 1990 pp. 75-76.

*Primary Examiner*—John S. Chu
*Attorney, Agent, or Firm*—Flehr Hohbach Test Albritton & Herbert LLP

[57] ABSTRACT

A method of planarizing a layer of material having a pre-determined thickness above a circuit feature on a semiconductor device is provided. A first layer of material is formed atop the surface of the semiconductor substrate and circuit feature to a pre-determined thickness. A thin, continuous trace layer of doped silicon oxide material is formed atop the first layer, and then a second layer of material is formed atop the trace layer. The second layer is planarized, and planarization is terminated upon reaching the trace layer, thereby providing a semiconductor with a planar layer.

21 Claims, 2 Drawing Sheets

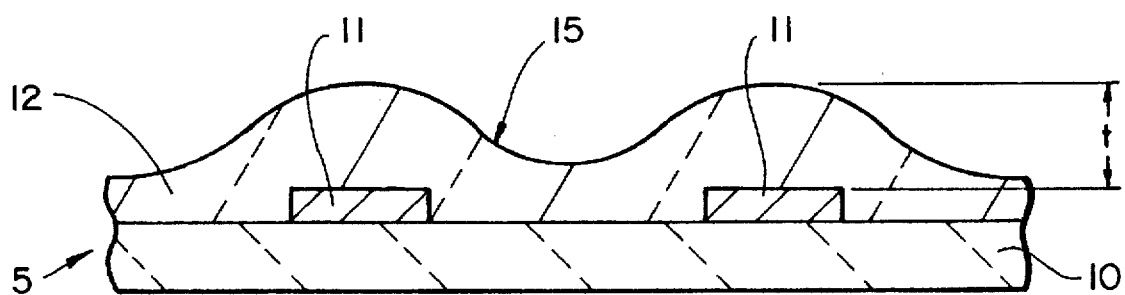
FIG_1
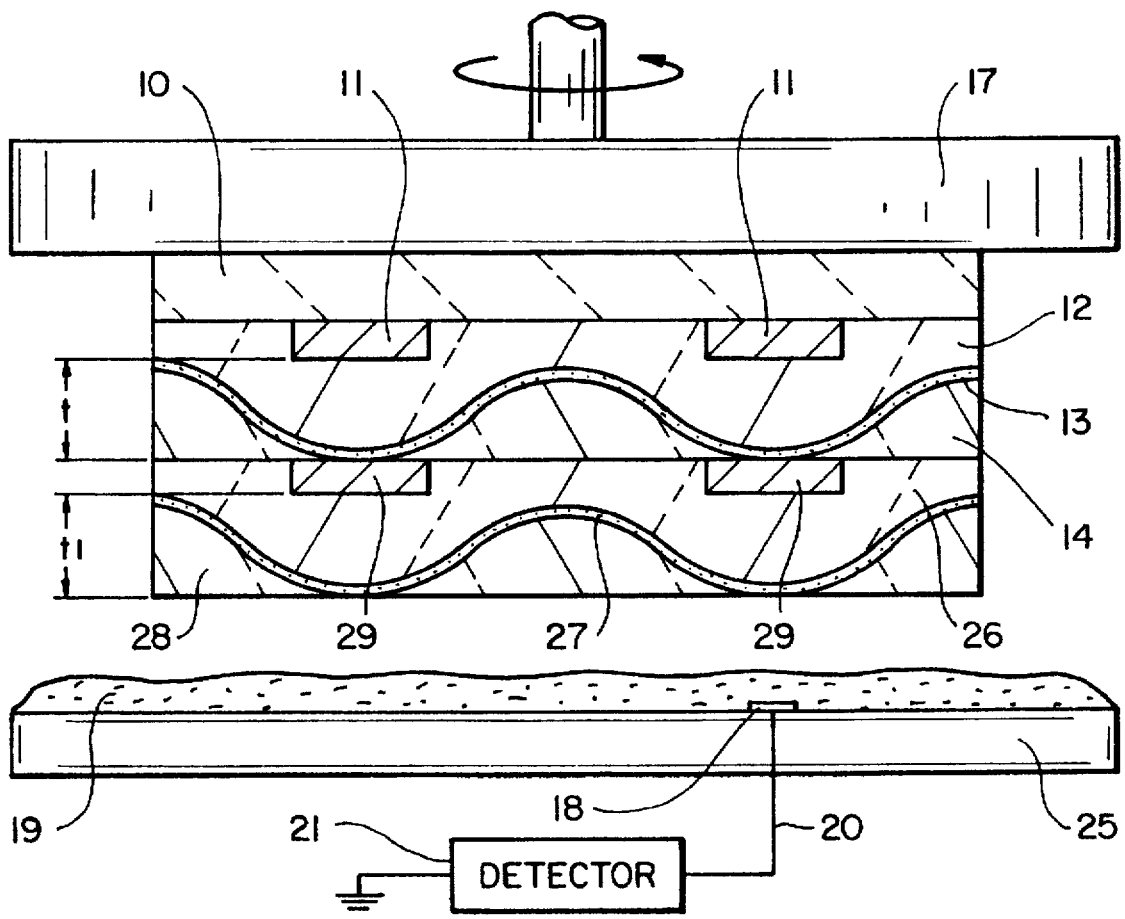
FIG_4

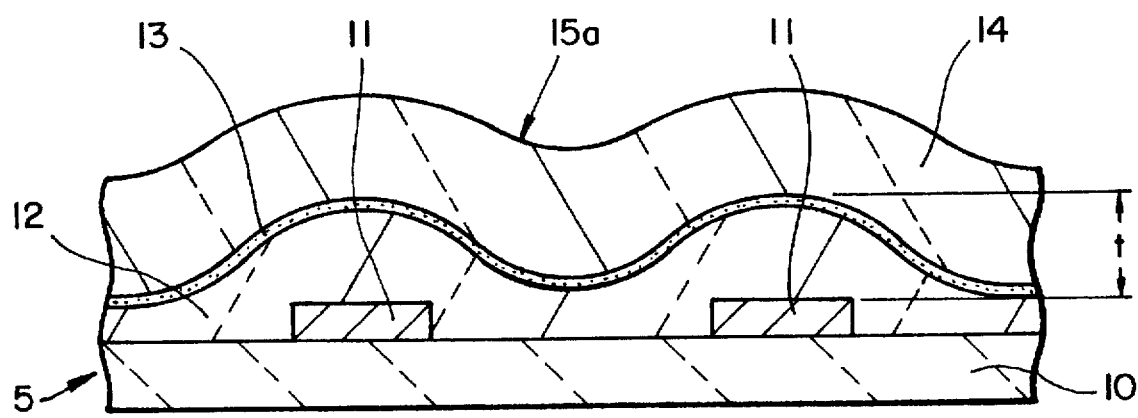
FIG_2
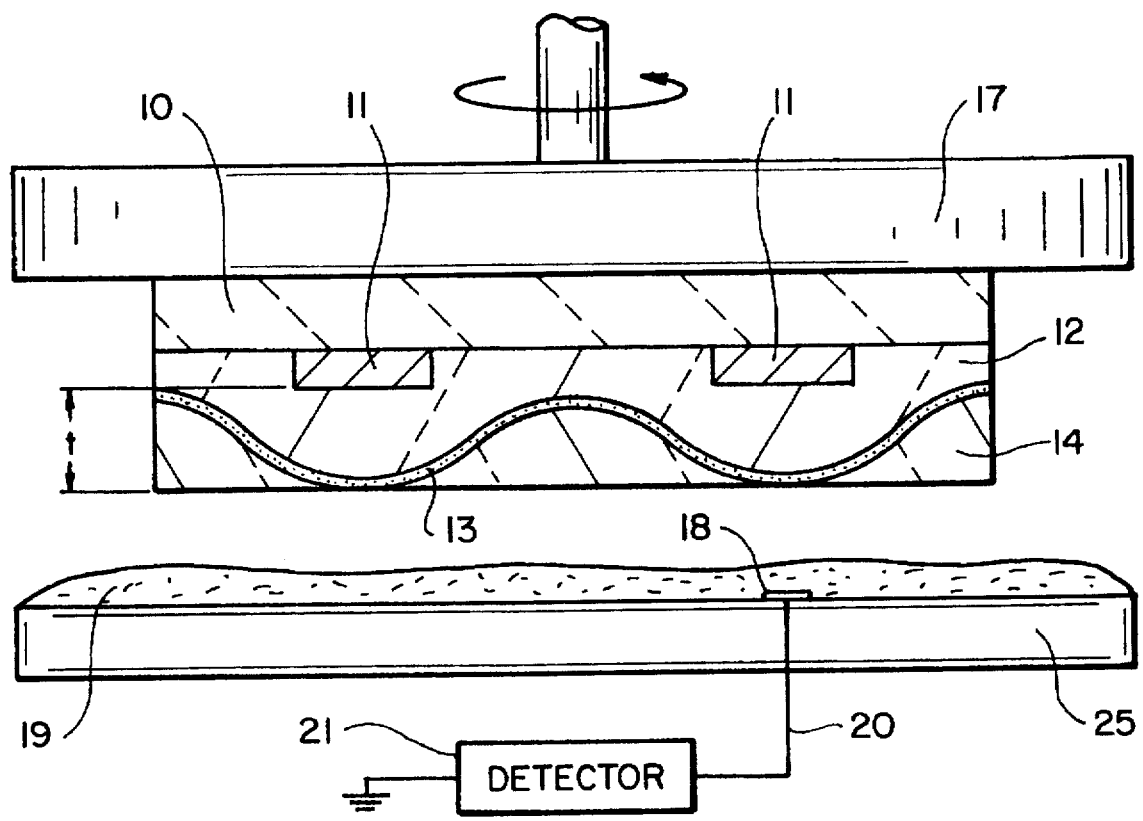
FIG_3

METHOD OF PLANARIZING A LAYER OF MATERIAL

BRIEF DESCRIPTION OF THE INVENTION

This invention relates generally to fabrication of semiconductor devices. More particularly, the invention relates to an improved method for planarizing a layer of material on a semiconductor device.

BACKGROUND OF THE INVENTION

Manufacturing of integrated circuits is becoming increasingly complex as the device density of such circuits increases. High density circuits require closely spaced interconnect lines and multiple layers of materials and structures, all in micron and submicron dimensions. Surface planarity of the semiconductor deteriorates significantly once a metal is covered with an oxide layer. The surface of the layer will have a topography which in general will conform to the sublayer. The prior structures and layers create surface topography with areas of irregular elevation, troughs and the like. As the layers increase, the irregularities become more pronounced. Such topography adversely effects the fine pattern resolution and depth-of-focus limitations required for lithography, deposition of films, etching of small dimension interconnect lines and the overall yield and performance of the integrated circuit. Consequently it is desirable to planarize the layers to minimize irregularities in the topography of the surface and thus enhance the processing and performance of the integrated circuit.

Planarization is a process used to create smooth, planar layers on wafers. Chemical Mechanical Polishing (CMP) is one technique of planarization which essentially provides for polishing a wafer by rubbing a polishing pad against the wafer to grind the surface layer. Often, the polishing pad is saturated with an abrasive slurry solution which may aid the planarization. A common slurry used is colloidal silica in an aqueous KOH solution. CMP tools are well known in the art, such tools are disclosed in U.S. Pat. Nos. 3,841,031 and 4,193,226. The tools include a polishing wheel with the wafer attached. As the wheel rotates the wafer is forced against a wetted polishing surface and the surface is planarized.

A critical aspect of the planarization process is determining when to cease planarizing or polishing. Predicting such end-point is very difficult. Various methods of determining the end point are known in the art.

One method is by visual inspection. According to this method, the wafers are periodically taken from the CMP machine and inspected. Generally, a metal is chosen with a color distinct from the overlying layer to be removed, such that the color change becomes visible as the overlying layer is polished. The CMP is then stopped.

U.S. Pat. No. 5,265,378 discloses another method of end-point detection during the CMP process. A contact structure, similar to the functional device features to be fabricated, is formed atop a wafer and extends to a height where termination of polishing is desired. The contact structure is not a layer but is like a device structure such as a metallic button or inoperative gate. The contact structure is formed by appropriate fabrication steps such as deposition, etching and mastring. It is preferred that such contact structures be formed in "sacrificial" areas of the wafer where active components will not be affected. In another embodiment of the '378 patent, vias are fabricated by ion milling or etching or the like, and then filled with conductive material, thus providing a conductive path which is coupled to a measuring apparatus. A change in resistance/impedance is observed when the contact structure becomes exposed to a slurry during polishing. The CMP process is then terminated. In contrast to this prior art technique, the method of the present invention forms a functional layer of a desired thickness and then a simple layer of trace dimension is formed atop the functional layer. The trace layer will serve to trigger termination of the planarization process when it is reached. The trace layer does not require elaborate fabrication steps and it does not impact or adversely affect the electrical properties of the functional layer or the circuit features. Thus, there is no limitation on placement of the trace layer as there is with the contact structure disclosed in the prior art patent.

U.S. Pat. No. 5,272,117 also discloses a method of planarizing a layer and endpoint detection during a CMP or etch-back process. A first layer is formed over an integrated circuit layer. Another thick layer is formed over the first layer and the thick layer is etched to expose portions of the first layer and to form spacers of a desired thickness adjacent to the sidewall formations of the first layer. A second layer is formed over the first layer and the spacers, then polishing or an etch-back operation is performed until the spacers are detected by either chemical or electrical means. Another embodiment of the invention provides for different rates of planarization between the spacers and the second layer of material whereby the second layer of material planarizes at a faster rate than the spacer material. The endpoint is signaled by a change in polishing pressure. Another detection mechanism is by detecting a chemical change in the slurry. Like the '378 patent discussed above, this prior art technique utilizes a structure which in this case is a sidewall formation and spacer, not a layer, to terminate the planarization process. Again, elaborate fabrication steps are necessary to practice the method of the '117 patent.

Another end-point detection technique known in the art utilizes selective etching to prevent further etching of a layer. Such techniques are dependent upon the chemistry of the slurry used and the selectivity ratios of the layers to be etched. An example of this type of method is disclosed in U.S. Pat. No. 5,169,491 whereby a layer of undoped silicon dioxide is formed atop a wafer and then a layer of borophosphosilicate glass (BPSG) is formed on the silicon dioxide layer. The BPSG layer is polished using a slurry with a significant etch rate for the BPSG layer whereby etching of the BPSG layer proceeds at a greater rate relative to etching of the $SiO_2$. This limits etching of the $SiO_2$ layer which acts as an endpoint. This patent requires the use of a slurry with specified pH and solids concentration, and requires selection of materials with significant selectivity ratios. The method will not work if the etch selectivity of the two materials is not significantly different.

All of the above prior art methods require elaborate fabrication steps. Many of the methods require metallization steps, etching steps or fabrication of numerous layers of different materials. Such fabrication steps consume time which decrease throughput and increase cost. Further, one important limitation of some of the prior art is that the structures or spacers utilized for detecting the end-point of the process may affect the function of the device and thus their placement and size are a limitation. In addition, other methods allow only certain types of materials to be used whereby polishing rates must be different, or etch selectivity is a factor, all of which limit the materials that can be used. As will become apparent by the description below, the invention disclosed herein overcomes these limitations by providing a simple, easily incorporated process for forming a planarized layer.

OBJECTS AND SUMMARY OF THE INVENTION

It is an object of this invention to provide an improved method for planarizing a layer of material on a semiconductor device.

More particularly, it is an object of this invention to provide an improved method for detecting the end point during the planarization process.

Another object of this invention is to provide an in-situ method for end-point detection.

A further object herein is to provide a method for end-point detection during CMP which can be easily incorporated into the semiconductor fabrication process.

These and other objects are achieved by the method herein disclosed of forming a planar layer having a pre-determined thickness above a circuit feature of a semiconductor device comprising the steps of forming a first layer of a first material atop a surface of a semiconductor substrate and circuit feature whereby the pre-determined thickness is above the circuit feature. Once the first layer is formed, a trace layer of a second material is formed atop the first layer. Then a second layer of material is formed on the trace layer. The second layer is then planarized. During planarization, the trace layer above the circuit features will be reached as the second layer is removed. Upon reaching the trace layer, planarization will terminate. The resultant wafer will contain a planarized layer having a desired thickness above the circuit feature.

BRIEF DESCRIPTION OF THE DRAWINGS

Other objects and advantages of the invention become apparent upon reading of the detailed description of the invention provided below and upon reference to the drawings, in which:

FIG. 1 is a cross-sectional view of a semiconductor wafer, having circuit features and an insulating layer;

FIG. 2 is a cross-sectional view of the semiconductor wafer of FIG. 1 partially processed in accordance with the invention;

FIG. 3 is a cross-sectional view of the semiconductor wafer of FIG. 2 after planarization and illustrates the end point detection apparatus;

FIG. 4 is a cross-sectional view depicting a semiconductor wafer containing multiple layers after planarization in accordance with another embodiment of the invention;

DETAILED DESCRIPTION OF THE INVENTION

Turning to the drawings, wherein like components are designated by like reference numbers in the figures, FIG. 1 shows a semiconductor device 5 which includes a substrate 10, a plurality of circuit features 11 and an insulating layer 12. Such circuit features 11 can be any of the components known in the art such as polysilicon gates, drains, metal plugs, lightly doped drain (LDD) spacers, interconnecting lines and the like. All such circuit features 11 are functioning components, there is no limitation on their placement and they are not required for detection of the end-point as in certain Patents referred to herein. The circuit features are formed using fabrication steps well known in the art.

After the circuit features 11 are fabricated, a first layer 12 of a first material is formed atop the substrate 10 and circuit features 11. Layer 12 may be formed by Chemical Vapor Deposition (CVD) or plasma enhanced CVD (PECVD) or by other suitable methods known in the art, and may be formed of a single material or may be a composition of multiple materials formed atop one another such as silicon nitride followed by silicon dioxide or BPSG. The first layer 12 is formed until the layer reaches a selected thickness (t) above circuit features 11. The thickness (t) may correspond to the desired insulating or dielectric film layer thickness calculated for the required electrical function of the device. In a preferred embodiment, such first layer 12 is a dielectric material known as an inter-layer dielectric such as $SiO_2$. In an alternative embodiment of the invention, first layer 12 may be any other type of desired layer, or combination of different layers. When formed, first layer 12 will be non-planar, with surface irregularities and rugged topography 15 which generally conforms to the underlying circuit features 11 and substrate 10. It is desirable to provide a planar surface prior to additional fabrication, thus the present invention provides a method for planarization which includes formation of a trace layer 13 on the surface of the first layer 12, FIG. 2.

The trace layer 13 is of a material that can be detected during the planarizing operation. A second layer 14 of material is formed atop trace layer 13. Second layer 14 may be the same material as first layer 12, such that trace layer 13 will be embedded within one type of material. Alternatively, second layer 14 may be a different material from first layer 12. In either case, second layer 14 will be non-planar with rough topography 15a generally conforming to the underlying layers 12 and 13 and circuit features 11.

Thus, the resulting semiconductor structure contains circuit features with an overlying layer, and within such overlying layer an in situ trace layer is provided. The trace layer 13 is a thin layer and will not adversely affect the circuit features 11. In the preferred embodiment, the trace layer 13 is either borosilicate glass (BSG), phosphosilicate glass (PSG), borophosphosilicate glass (BPSG) or arsenosilicate glass (AsSG), with BPSG being the most preferred.

To achieve the desired planar surface, a planarization process is performed on the surface of second layer 14. Planarization may be accomplished by CMP. Referring to FIG. 3, the substrate 5 is inverted and attached to a rotating wheel 17 such that the layer 14 is facing a flat polishing table 25, as shown in FIG. 3. The wheel 17 rotates and applies the layer 14 to the surface of flat polishing table 25. Generally a slurry 19 is applied to the table 25 to enhance the CMP action. The CMP process may be carried out by any CMP tool known in the art; such CMP tool may be used to control polishing pressure, temperature, slurry feed rates, wafer and pad rotation rates during the process.

It is critical that planarization of the layer not proceed beyond a desired endpoint. If the CMP process is not properly controlled, polishing may proceed too far into the layer and adversely affect the desired properties of such layer and possibly damage the underlying circuit features. Thus, it is highly desirable to monitor the CMP process and to stop planarization when a selected thickness is reached. According to the method of the present invention, the trace layer 13 provides an in situ end-point location. The CMP process is observed and monitored as illustrated in FIGS. 3 and 4 to determine when the trace layer 13 is reached. Referring again to FIG. 3, second layer 14 is planarized until trace layer 13 is reached. Thin trace layer 13 has been formed, and is thus reached, at the desired thickness (t). The trace layer 13 will signal the proper thickness (t), and trace layer 13 is sensed and the planarization operation is terminated. The resulting surface of the semiconductor wafer is now planar and contains a layer of material with a selected thickness (t) above the circuit feature.

To detect the trace layer 13, various sensing mechanisms can be employed. The sensing mechanism is more fully appreciated with reference to FIGS. 3 and 4. The method of the invention provides sensor 18 contained within the polishing environment, attached to flat polishing table 25 as illustrated in FIG. 3. A plurality of sensors (not shown) may be placed at different locations on polishing table 25. Polishing proceeds with wheel 17 rotating and urging second layer 14 against polishing table 25. Second layer 14 is removed by the CMP action and when a portion of trace layer 13 is exposed, the sensor 18 will detect a change in the environment. Upon such detection, the CMP process is stopped. The resulting wafer will contain a planar surface of a desired film thickness.

Referring again to FIG. 3, one embodiment of the invention, a slurry 19 is employed during the CMP process. Such slurry 19 exhibits a particular chemical characteristic indicative of its chemical composition. The trace layer 13 exhibits a different chemical characteristic depending upon its chemical composition. During polishing, the sensor 18 detects the chemical characteristic of the slurry 19. When a portion of the trace layer 13 becomes exposed, the sensor 18 will observe a change in the chemical characteristic of the slurry 19 due to introduction of chemical from the trace layer 13 as such trace layer 13 is polished by polishing table 25. Sensor 18 sends a signal via line 20 to an input of apparatus 21 which measures the input signal and detects a noticeable change in the sensor property. Upon detection of the noticeable change, apparatus 21 will generate an output control signal which will terminate the CMP process. In an alternative embodiment, a slurry is not used and the trace layer is detected by observation of a noticeable change in the chemical characteristic of the ambient environment. Any chemical characteristic can be detected, such as a shift in pH, or measurement of the chemical species of the trace layer 13. Preferably, the method of the present invention will employ the following: the trace layer deposited shall be BPSG, a slurry consisting of small abrasive particles of a controlled size in a disbursing solution is used during the planarizing process, and a chemical element detector commonly known in the art is used to detect the present of either the boron or the phosphorous from trace layer 13. Upon detection, the planarization process is terminated. Alternatively, a conductivity detector known in the art can be used.

In many applications, a number of layers are formed to create a multilevel integrated circuit. In such instance the invention provides a plurality of trace layers 13 and 27, as shown in FIG. 5, a second embodiment of the invention. Substrate 10, circuit features 11, first layer 12, trace layer 13 and second layer 14 are formed according to the above detailed description of the invention. Second layer 14 is planarized until a portion of trace layer 13 is exposed, in accordance with the method of the invention described above. Thus, the invention provides a planar second layer 14 upon which further fabrication may proceed to form a multilevel integrated circuit.

To form the multilevel integrated circuit, the inventive method may simply be repeated. As illustrated in FIG. 4, a second set of circuit features 25 are formed atop of planar layer 14. Layer 26 is formed to a desired thickness (t1), trace layer 27 is formed and layer 28 is formed atop trace layer 27. Layer 28 is then planarized in accordance with the invention as described above. It should be understood that the invention is not limited to two layers but may be utilized for any number of layers in a multilevel semiconductor. Further, it is apparent to one skilled in the art that the invention contemplates selection of the appropriate thickness (t) for each layer, along with selection of various materials depending upon the desired application. Moreover, each planarized layer within the multilevel semiconductor may perform a different function. For example, in FIG. 4, circuit features 25 can be eliminated, and layers 26 and 28 can be formed of a metallic material.

As just described, the method of the invention provides for formation of the trace layer atop, or within, any layer on a wafer. Thus, planarization and end-point detection according to the present invention can be practiced at any step of fabrication and within any layer in a multilayer semiconductor device.

A particular advantage made apparent by the above description, is the simplicity of design of the inventive method. The invention eliminates the need for timely visual monitoring to detect the end-point. The invention eliminates the complex fabrication of various structures utilized in other methods referenced herein. According to the method of the present invention, a single trace layer 13 is formed. The trace layer 13 can be formed by CVD or PECVD in a continuous process during the deposition of first layer 12 and second layer 14. First layer 12 is deposited to desired thickness (t), at which point valves conveying source gases which form layer 12 are closed and/or different valves are opened which in turn convey source gases to form trace layer 13. The thin trace layer 13 is quickly deposited relative to first layer 12, and then the trace source valves are closed. Now the applicable valves are opened and layer 14 is formed. Thus, no elaborate fabrication steps are necessary. The method may be practiced utilizing the same deposition equipment and deposition parameters as used to fabricated the integrated circuit. No etching, metallization, or fabrication of numerous layers is necessary as required by certain patents referenced herein. Thus, an improved method for forming a planar layer has been provided.

While the invention has been described in connection with specific embodiments, it is evident that many variations, substitutions, alternatives and modifications will be apparent to those skilled in the art in light of the foregoing description. Accordingly, this description is intended to encompass all such variations, substitutions, alternatives and modifications as fall within the spirit of the appended claims.

What is claimed is:

1. A method of forming a planar layer having a predetermined thickness above a circuit feature of a semiconductor device comprising the steps of:

forming a first layer of a first material atop a surface of a semiconductor substrate and circuit feature with said predetermined thickness above said circuit feature;

forming in one fabrication step, a thin continuous trace layer of a doped silicon oxide material on the entire surface of said first layer;

forming a second layer of material on said trace layer;

planarizing said second layer by removing portions of said second layer;

detecting when the removal of said second layer reaches a portion of said trace layer; and terminating planarization upon detection of said portion of said trace layer whereby the resulting layer is planar having said pre-determined thickness above said circuit features.

2. The method of claim 1 wherein said second layer is the same material as said first layer.

3. The method of claim 1 wherein detection of a portion of said trace layer is by detecting the chemical species of said trace layer.

4. The method of claim 1 wherein the planarization step further comprises:

chemical mechanical polishing said second layer with a slurry, said slurry exhibiting a chemical characteristic; and during polishing detecting the chemical characteristic of said slurry and observing a noticeable change in said chemical characteristic when a portion of said trace layer becomes exposed to said slurry.

5. The method of claim 1 wherein said trace layer exhibits conductivity, and detection of a portion of said trace layer is by detecting the conductivity of said trace layer.

6. The method of claim 1 wherein said trace layer is borosilicate glass.

7. The method of claim 1 wherein said trace layer is phosphosilicate glass.

8. The method of claim 1 wherein said trace layer is arsenosilicate glass.

9. The method of claim 1 wherein said trace layer is borophosphosilicate glass.

10. A method of forming a planar layer having a predetermined thickness above a circuit feature of a semiconductor device comprising the steps of:

(a) forming a first layer of a first a material atop a surface of a semiconductor substrate and circuit feature with said predetermined thickness above said circuit feature;

(b) forming in one fabrication step, a thin continuous trace layer of a doped silicon oxide material on the entire surface of said first layer;

(c) forming a second layer of material on said trace layer;

(d) planarizing said second layer by removing portions of said second layer;

(e) detecting when the removal of said second layer reaches a portion of said trace layer;

(f) terminating planarization upon detection of said portion of said trace layer whereby the resulting layer is planar having said pre-determined thickness above said circuit features; and (g) repeating steps (a), (b), (c), (d), (e), and (f) in sequence N times, where N is an integer and N is greater than, or equal to, 1.

11. The method of claim 10 wherein said second layer is the same material as said first layer.

12. The method of claim 10 wherein said first layer in repetitive step (g) is a different material from said first layer in step (a).

13. The method of claim 10 wherein said trace layer in repetitive step (g) is a different material from said trace layer in step (b).

14. The method of claim 10 wherein said second layer in repetitive step (g) is a different material from said second layer in step (c).

15. The method of claim 10 wherein detection of a portion of said trace layers during the repetitive sequences is by detecting the chemical species of said trace layer.

16. The method of claim 10 wherein the planarization steps further comprises:

chemical mechanical polishing said second layers during the repetitive sequences with a slurry, said slurry exhibiting a chemical characteristic; and during polishing detecting the chemical characteristic of said slurry and observing a noticeable change in said chemical characteristic during each repetitive sequence when a portion of said trace layer becomes exposed to said slurry.

17. The method of claim 10 wherein said trace layers exhibit conductivity, and detection of a portion of said trace layer is by detecting the conductivity of said trace layer.

18. The method of claim 10 wherein said trace layer are borosilicate glass.

19. The method of claim 10 wherein said trace layer are phosphosilicate glass.

20. The method of claim 10 wherein said trace layer are arsenosilicate glass.

21. The method of claim 10 wherein said trace layer are borophosphosilicate glass.

* * * * *